(12) United States Patent
Frost et al.

(10) Patent No.: US 9,377,512 B2
(45) Date of Patent: Jun. 28, 2016

(54) BATTERY STATE ESTIMATOR COMBINING ELECTROCHEMICAL SOLID-STATE CONCENTRATION MODEL WITH EMPIRICAL EQUIVALENT-CIRCUIT MODEL

(71) Applicant: GM GLOBAL TECHNOLOGY OPERATIONS LLC, Detroit, MI (US)

(72) Inventors: Patrick Frost, Novi, MI (US); Patricia M. Laskowsky, Ann Arbor, MI (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 562 days.

(21) Appl. No.: 13/889,964

(22) Filed: May 8, 2013

(65) Prior Publication Data

US 2014/0333317 A1 Nov. 13, 2014

(51) Int. Cl.
*G01N 27/416* (2006.01)
*G01R 31/36* (2006.01)
*H01M 10/44* (2006.01)
*B60L 11/18* (2006.01)

(52) U.S. Cl.
CPC ......... *G01R 31/3606* (2013.01); *B60L 11/1805* (2013.01); *B60L 11/1861* (2013.01); *B60L 11/1864* (2013.01); *B60L 11/1877* (2013.01); *G01R 31/3624* (2013.01); *G01R 31/3651* (2013.01); *H01M 10/44* (2013.01); *B60L 2240/545* (2013.01); *B60L 2240/547* (2013.01); *B60L 2240/549* (2013.01); *H01M 2220/20* (2013.01); *Y02T 10/7005* (2013.01); *Y02T 10/7044* (2013.01); *Y02T 10/7061* (2013.01)

(58) Field of Classification Search
USPC .......................................... 324/430
See application file for complete search history.

(56) References Cited

U.S. PATENT DOCUMENTS

2009/0072792 A1* 3/2009 Kobayashi ......... G01R 31/3624
320/134
2013/0317771 A1* 11/2013 Laskowsky ........ G01R 31/3675
702/63

OTHER PUBLICATIONS

Frost Patrick, U.S. Appl. No. 13/756,327, filed Jan. 31, 2013 entitled "Method to Detect Open-Circuit Voltage Shift Through Optimization Fitting of the Anode Electrode Half-Cell Voltage Curve".

* cited by examiner

*Primary Examiner* — Robert Grant
(74) *Attorney, Agent, or Firm* — John A. Miller; Miller IP Group, PLC (57) ABSTRACT

A battery state estimator which combines an electrochemical solid-state concentration model with an empirical equivalent-circuit model. The battery state estimator uses a reduced-order physics-based electrochemical solid-state concentration model to calculate open circuit voltage of a battery cell, and uses the calculated open circuit voltage in an equivalent-circuit model to evaluate a diffusion voltage drop and other battery cell parameters. The battery state estimator is implemented in an online estimator framework using an extended Kalman filter, with a measured terminal voltage and measured current as inputs. A state of charge of the battery cell can be determined from the calculated open circuit voltage, and the state of charge along with the other parameters from the equivalent-circuit model are used to evaluate battery pack performance and to control battery pack charging and discharging.

20 Claims, 5 Drawing Sheets

BATTERY STATE ESTIMATOR COMBINING ELECTROCHEMICAL SOLID-STATE CONCENTRATION MODEL WITH EMPIRICAL EQUIVALENT-CIRCUIT MODEL

BACKGROUND OF THE INVENTION

1. Field of the Invention

This invention relates generally to a battery state estimator for cells in a battery pack and, more particularly, to a hybrid battery state estimator which combines an electrochemical solid-state concentration model with an empirical equivalent-circuit model, where the hybrid model is computed using an extended Kalman filter routine to provide values of open circuit voltage and other battery parameters which are accurate even under high-current operating conditions.

2. Discussion of the Related Art

Electric vehicles and gasoline-electric or diesel-electric hybrid vehicles are rapidly gaining popularity in today's automotive marketplace. Electric and hybrid-electric vehicles offer several desirable features, such as reducing or eliminating emissions and petroleum-based fuel consumption at the consumer level, and potentially lower operating costs. A key subsystem of electric and hybrid-electric vehicles is the battery pack, which plays a large part in dictating the vehicle's performance. Battery packs in these vehicles typically consist of numerous interconnected cells, which are able to deliver a lot of power on demand. Maximizing battery pack performance and life are key considerations in the design and operation of electric and hybrid electric vehicles.

A typical electric vehicle battery pack includes two or more battery pack sections, with each section containing many individual battery cells as needed to provide the required voltage and capacity. In order to optimize the performance and durability of the battery pack, it is important to monitor the state of charge and other parameters of the battery cells. State of charge of a cell is typically determined based on the open circuit voltage of the cell, using a relationship which is defined in the form of a state of charge vs. open circuit voltage (SOC-OCV) curve. However, open circuit voltage can only be directly measured when a battery cell has equilibrated for several hours with no charging or discharging current, at which time open circuit voltage is equal to terminal voltage. During charging or discharging of an electric vehicle battery pack, and for some time thereafter, open circuit voltage can only be estimated based on measured terminal voltage.

One existing technique for estimating open circuit voltage from terminal voltage of a battery cell during charging or discharging is to use an equivalent-circuit model of the battery cell. An equivalent-circuit model uses empirically-derived circuit elements, such as capacitors and resistors, to model the battery cell's behavior. However, under high-current charging or discharging conditions, equivalent-circuit models typically lose accuracy, as diffusion effects cannot be accurately modeled under these conditions. A battery state estimator is needed which can accurately model battery cell behavior under real-world operating conditions, and which is computationally efficient enough to run in real time.

SUMMARY OF THE INVENTION

In accordance with the teachings of the present invention, a battery state estimator is disclosed which combines an electrochemical solid-state concentration model with an empirical equivalent-circuit model. The battery state estimator uses a reduced-order physics-based electrochemical solid-state concentration model to calculate open circuit voltage of a battery cell, and uses the calculated open circuit voltage in an equivalent-circuit model to evaluate a diffusion voltage drop and other battery cell parameters. The battery state estimator is implemented in an online estimator framework using an extended Kalman filter, with a measured terminal voltage and measured current as inputs. A state of charge of the battery cell can be determined from the calculated open circuit voltage, and the state of charge along with the other parameters from the equivalent-circuit model are used to evaluate battery pack performance and to control battery pack charging and discharging.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a battery state estimator combining an electrochemical solid-state concentration model with an empirical equivalent-circuit model is merely exemplary in nature, and is in no way intended to limit the invention or its applications or uses. For example, the discussion that follows is directed to battery cells used in electric vehicle battery packs, but the hybrid battery state estimator is equally applicable to battery cells in other vehicular and non-vehicular applications.

Battery packs in electric vehicles and gasoline-electric or diesel-electric hybrid vehicles (hereinafter collectively referred to simply as "electric vehicles") typically consist of hundreds of individual cells. In one popular lithium-ion rechargeable battery chemistry, each cell produces approximately 3.7 volts nominally, with the exact value depending on state of charge and other factors. Many cells connected serially in a module provide the high voltage necessary to drive electric vehicle motors, while multiple cells can be arranged in parallel in cell groups to increase energy capacity.

In order to manage the charging and discharging of an electric vehicle battery pack, it is important to know the state of charge of the battery cells at all times. State of charge is a number, expressed as a percentage, which indicates how much electrical energy is stored in a battery cell relative to the capacity of the cell. That is, a fully charged battery cell has a state of charge of 100%, while a fully discharged cell has a state of charge of 0%.

State of charge of a cell is typically determined based on the open circuit voltage of the cell, using a known relationship which is defined in the form of a state of charge vs. open circuit voltage (SOC-OCV) curve. Using this relationship, a battery supervisory controller in an electric vehicle can monitor the state of charge of the cells in a battery pack, and hence the state of charge of the overall battery pack, at all times. However, open circuit voltage can only be directly measured when a battery cell has equilibrated for several hours with no charging or discharging current, at which time open circuit voltage is equal to terminal voltage. During charging or discharging of an electric vehicle battery pack, and for some time thereafter, open circuit voltage is not equal to measured terminal voltage. Some sort of modeling tool is needed to estimate open circuit voltage from terminal voltage during and following battery pack charging and discharging.

Figure 1:
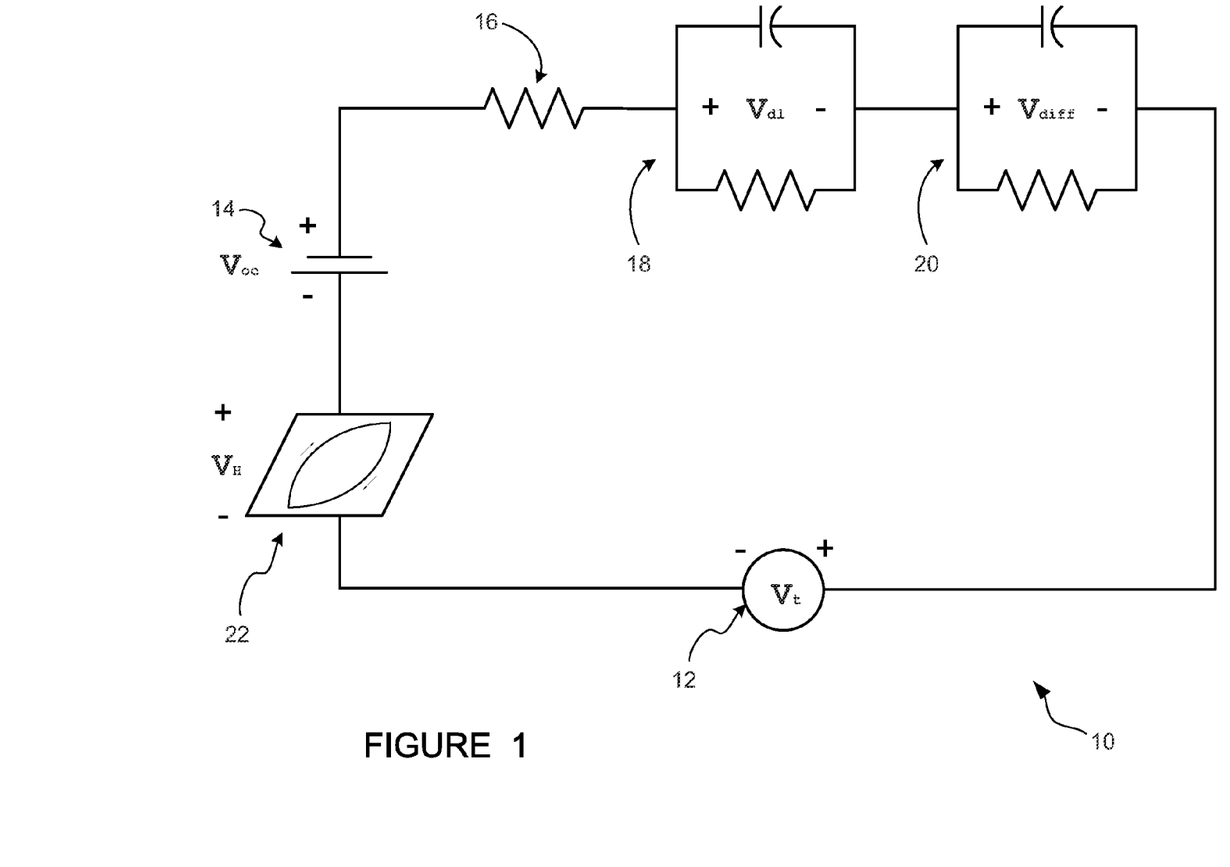
FIG. 1 is a schematic diagram of a traditional equivalent-circuit model which can be used as a battery state estimator.

FIG. 1 is a schematic diagram of a traditional equivalent-circuit model 10 which can be used as a battery state estimator. In the equivalent-circuit model 10, various electrical circuit elements are used to simulate the behavior of a battery cell. The equivalent-circuit model 10 is typically empirically-derived, where resistance and capacitance properties are established so that the behavior of the equivalent-circuit model 10 matches the measured behavior of the subject battery cell.

The equivalent-circuit model 10 includes a terminal voltage ($V_t$) 12, which can readily be measured by taking a voltage reading across the two terminals of the battery cell. Open circuit voltage ($V_{oc}$) 14 is typically the parameter that is solved for in the equivalent-circuit model 10, based on the measured terminal voltage 12 and other input properties of the model 10. An ohmic resistance ($R_O$) 16 is the apparent resistance of the electrical conductors in the battery cell, and is manifested as the instantaneous response of the terminal voltage to changes in current. A double-layer voltage drop ($V_{dl}$) 18 represents the potential of charge accumulation or dissipation that occurs at the electrode interfaces of the battery cell, which are typically modeled by one or more parallel resistor/capacitor pairs. While only a single R/C pair (with values $R_{dl}$ and $C_{dl}$) is used to model the voltage drop ($V_{dl}$) 18 in the model 10, two or more pairs may be used, where each pair has a different time constant.

A diffusion-effect voltage drop ($V_{diff}$) 20 represents the diffusion effects of the battery cell, which are related to intra-particle movement through porous electrodes in the battery cell, and which produce voltage transients slower than the double-layer voltages. In the equivalent-circuit model 10, the diffusion-effect voltage drop ($V_{diff}$) 20 is modeled with a resistor and capacitor (with values $R_{diff}$ and $C_{diff}$). A hysteresis voltage ($V_H$) 22 may also be included in the equivalent-circuit model 10, and accounts for any difference between charging and discharging performance. The hysteresis voltage ($V_H$) 22 can also be incorporated into calculation of the open circuit voltage ($V_{oc}$) 14, and in some battery chemistries the hysteresis voltage ($V_H$) 22 can be disregarded as these types of battery cells exhibit negligible hysteresis.

As discussed above, the equivalent-circuit model 10 is tuned to simulate the known behavior of the battery cell which it is designed to model, where the cell behavior is experimentally measured under charging and discharging conditions. The values of the resistances ($R_O$, $R_{dl}$ and $R_{diff}$) and capacitances ($C_{dl}$ and $C_{diff}$) are empirically derived to match the measured battery cell performance. Once the values of the resistances and capacitances are established, the equivalent-circuit model 10 can be used as a battery state estimator for battery cells in a battery pack, providing an estimated open circuit voltage based on measured terminal voltage data.

However, as noted previously, the simple R/C modeling of $V_{diff}$ loses accuracy under high current-draw conditions. For this reason, a different approach to finding $V_{diff}$ is taken in the battery state estimator described later in FIG. 3.

Figure 2:
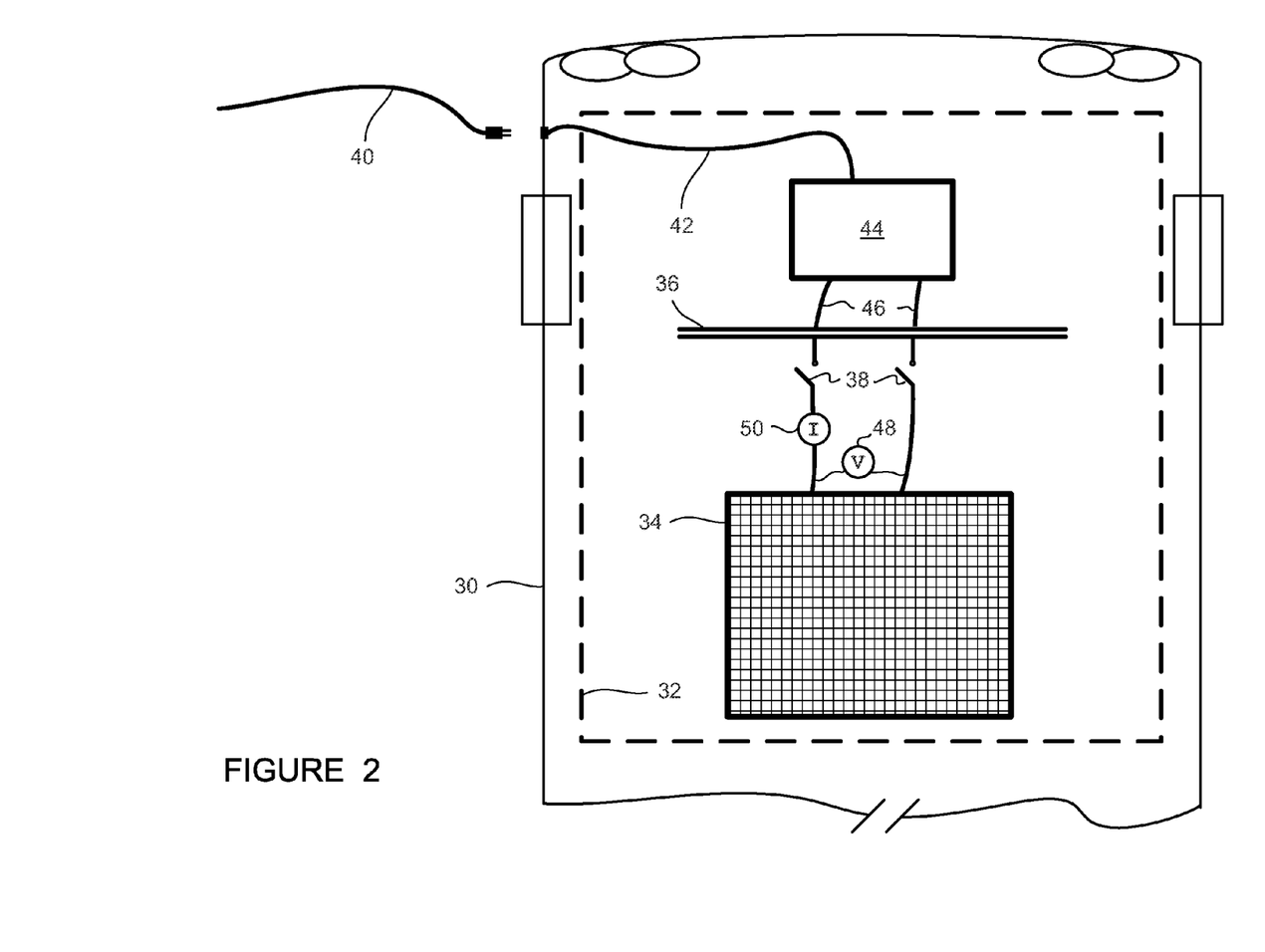
FIG. 2 is a block diagram of a system for determining state of charge and other parameters for cells in a battery pack used in an electric vehicle.

A battery state estimator using the equivalent-circuit model 10 shown in FIG. 1, and the innovative hybrid battery state estimator shown later in FIG. 3, can be implemented in an electric vehicle as follows. FIG. 2 is a block diagram of a vehicle 30 including a system 32 for estimating a state of charge and other parameters of cells in a battery pack 34. The battery pack 34 provides power via a high voltage bus 36 to one or more electric motors (not shown) which drive the wheels of the vehicle 30. Contactors 38 electrically connect the battery pack 34 to the high voltage bus 36. The vehicle 30 may be an electric or hybrid-electric vehicle which allows plug-in charging of the battery pack 34 via a power cord 40 which is typically connected to the utility power grid. The vehicle 30 may also include an internal combustion engine and a generator (not shown) as an additional source of charging energy. An internal cable 42 routes the charging current to a controller 44, which controls the charging and discharging and monitors battery pack conditions—such as voltage, current and temperature. In the configuration shown, the controller 44 is also configured to estimate the state of cells in the battery pack 34, using the hybrid battery state estimator described below. In another configuration, the battery state estimator calculations could be performed by a second control module (not shown) other than the controller 44.

Positive and negative leads 46 carry current to and from the battery pack 34, as controlled by the controller 44. A voltmeter 48, in communication with the controller 44, measures terminal voltage of cells in the battery pack 34. A current sensor, or ammeter 50, also in communication with the controller 44, measures charging current during charging, and discharging current during driving of the vehicle 30. Other details of the system 32, not essential to its understanding, are omitted for clarity.

It is to be understood that the controller 44 includes a memory module and a microprocessor or computing device which is configured to perform the calculations discussed in detail below. That is, the methods are to be carried out using a specifically programmed processor, as opposed to on a sheet of paper or in a person's head.

As described above, the equivalent-circuit model 10 cannot always accurately predict open circuit voltage of the battery cell, especially in high current-draw conditions, due to the difficulty in modeling diffusion effects. FIG. 3 is a schematic diagram of a hybrid battery state estimator 60 which uses a reduced-order electrochemical solid concentration physics based model to determine open circuit voltage, and calculates diffusion effects and other parameters from and measured voltage and current.

The battery state estimator 60 includes a terminal voltage ($V_t$) 62, which can be measured by taking a voltage reading across the terminals of the battery cell. Open circuit voltage ($V_{oc}$) 64, rather than being solved for directly via the equivalent-circuit model, is computed using a reduced-order electrochemical solid-state concentration model, as will be discussed below. An ohmic resistance ($R_O$) 66 is used to calculate an I·R voltage drop based on current. The double-layer voltage drop described in the equivalent-circuit model 10 is modeled in the battery state estimator 60 as two voltage drops, $V_1$ (68)—with an R/C pair having values $R_1$ and $C_1$, and $V_2$ (70)—with an R/C pair having values $R_2$ and $C_2$.

A diffusion-effect voltage drop ($V_{diff}$) 72 is not modeled with a resistor and capacitor, as it was in the equivalent-circuit model 10. Rather, the diffusion-effect voltage drop ($V_{diff}$) 72 can be solved for as an output of the battery state estimator 60. A hysteresis voltage ($V_H$) 74 may also be included explicitly in the battery state estimator 60, or it may be implicitly included in the open circuit voltage calculation, or disregarded.

The values of the resistances ($R_0$, $R_1$ and $R_2$) and capacitances ($C_1$ and $C_2$) are empirically derived to match the measured battery cell performance, as described previously in the equivalent-circuit model 10. Beyond that, however, the battery state estimator 60 differs considerably from the equivalent-circuit model 10. Whereas the equivalent-circuit model 10 performs a straightforward calculation of open circuit voltage from the terminal voltage and the known resistances, capacitances and current, the battery state estimator 60 uses a reduced-order physics based model to estimate open circuit voltage ($V_{oc}$) 64, and the entire estimator 60 is modeled in an iterative numerical predictor-corrector (such as an extended Kalman filter). Thus, the battery state estimator 60 provides not only an accurately calculated open circuit voltage $V_{oc}$, but also values of the diffusion voltage $V_{diff}$ and the double layer voltages $V_1$ and $V_2$, all of which are used for power capability calculations related to the battery pack 34.

Following is a discussion of the open circuit voltage calculation using the reduced-order physics-based model. When reduced from first principles, the open circuit voltage of a full battery cell can be expressed as:

$$V_{oc} = U_p(soc_p) - U_n(soc_n) \quad (1)$$

Where $V_{oc}$ is the open circuit voltage of the full battery cell, $U_p(soc_p)$ is the open circuit voltage potential of the cathode half-cell at a particular state of charge (denoted by p for positive electrode), and $U_n(soc_n)$ is the open circuit voltage potential of the anode half-cell at a particular state of charge (denoted by n for negative electrode).

As a lithium-ion battery cell charges or discharges, the solid concentration of active material at the positive and negative electrodes changes. The solid concentration (without order reduction) is represented by a partial differential equation that has both spatial and time dependency. This would be too computationally intensive to solve in real time in the battery state estimator 60; therefore the solid concentration equation is reduced to an ordinary differential equation. The output of the ordinary differential equation is the solid concentration at the electrolyte-solid boundary. The open circuit voltage is a function of the normalized electrolyte-solid boundary concentration.

Equation (1) can thus be rewritten in the following form, where the state of charge is represented by the normalized solid concentration θ at both the cathode and the anode:

$$V_{oc} = U_p(\theta_p) - U_n(\theta_n) \quad (2)$$

Equation (2) can be further rewritten, replacing the normalized solid concentrations $\theta_p$ and $\theta_n$ as follows:

$$V_{oc} = U_p\left(\frac{c_{se,p}}{c_{s,max,p}}\right) - U_n\left(\frac{c_{se,n}}{c_{s,max,n}}\right) \quad (3)$$

Where $c_{se,p}$, is the concentration of active material at the solid-electrolyte interface at the cathode, $c_{s,max,p}$ is the maximum possible concentration of active material in the cathode (a known constant), $c_{se,n}$ is the concentration of active material at the solid-electrolyte interface at the anode, and $c_{s,max,n}$ is the maximum possible concentration of active material in the anode (also a known constant).

Referring again to FIG. 3, the voltage equation for the battery state estimator 60 can be written as follows:

$$V_t = V_1 + V_2 + I \cdot R_0 + V_{diff} + V_{oc} + V_H \quad (4)$$

Where the terms included in Equation (4) were all defined previously.

Substituting Equation (3) into Equation (4), and disregarding $V_H$, produces:

$$V_t = V_1 + V_2 + I \cdot R_0 + V_{diff} + U_p\left(\frac{c_{se,p}}{c_{s,max,p}}\right) - U_n\left(\frac{c_{se,n}}{c_{s,max,n}}\right) \quad (5)$$

Where the terms included in Equation (5) were all defined previously. In Equation (5), $V_t$ is measured by the voltmeter 48, while $V_1$ and $V_2$ can be modeled in terms of the known values of $R_1$, $R_2$, $C_1$ and $C_2$. Likewise, the voltage drop from $I \cdot R_0$ is also calculable from current measured by the current sensor 50. Thus, only the diffusion effect voltage $V_{diff}$ and the concentrations $c_{se,p}$, and $c_{se,n}$ are unknown.

As discussed above, the electrochemical solid-state concentration model is inherently complex, being characterized by partial differential equation. However, the state-based system can be simulated by discretizing a continuous time concentration model using a finite difference method, and using an extended Kalman filter to predict a current state based on a previous state and newly observed values. The Kalman filter, also known as linear-quadratic estimation (LQE), is an algorithm that uses a series of measurements observed over time, containing noise (random variations) and other inaccuracies, and produces estimates of unknown variables that tend to be more precise than those based on a single measurement alone. More formally, the Kalman filter operates recursively on streams of noisy input data to produce a statistically optimal estimate of the underlying system state. Extensions and generalizations to the Kalman filter method have also been developed, such as the extended Kalman filter which works on nonlinear systems such as the battery state estimator 60.

In one embodiment of the battery state estimator 60, discussed here, each solid particle in the electrodes is modeled as four discrete layers, where the solid concentration at each layer for a current time step k is a function of the solid concentration at that layer and it's neighbor layers for the previous time step k−1. In other words, for example, the solid concentration at layer 2 at time step k ($[c_{s,2}]_k$) is a function of the solid concentration at layers 1, 2 and 3 at time step k−1 ($[f(c_{s,1}, c_{s,2}, c_{s,3})]_{k-1}$).

Using the finite difference order-reduction approach described above, an extended Kalman filter state vector x can be defined which represents Equation (5), as follows:

$$x_k = \begin{bmatrix} V_1 \\ V_2 \\ c_{s,1} \\ c_{s,2} \\ c_{s,3} \\ c_{s,4} \\ R_0 \\ R_1 \\ R_2 \\ C_1 \\ C_2 \\ V_{diff} \end{bmatrix}_k = \begin{bmatrix} e^{-\Delta t/R_1 C_1} V_1 + I\Delta t/C_1 \\ e^{-\Delta t/R_2 C_2} V_2 + I\Delta t/C_2 \\ f_1(c_{s,1}, c_{s,2}) \\ f_2(c_{s,1}, c_{s,2}, c_{s,3}) \\ f_3(c_{s,2}, c_{s,3}, c_{s,4}) \\ f_4(c_{s,3}, c_{s,4}) \\ R_0 \\ R_1 \\ R_2 \\ C_1 \\ C_2 \\ V_{diff} \end{bmatrix}_{k-1} \quad (6)$$

Where Δt is the length of the time step (time difference between k and k−1), I is the measured current, and all of the other variables have been defined previously. At each time step k, the extended Kalman filter routine computes values for the voltages and concentrations in the state vector x. The extended Kalman filter also computes a system covariance matrix P that is used to update the state correction gain. The process operates in a continuous prediction-correction cycle, as is understood by those skilled in the art of state-space system estimation.

As the system model runs in the battery state estimator 60, at each time step k, the open circuit voltage is computed as:

$$V_{oc} = U_p(c_{s,4}, I) - U_n(c_{s,4}, I) \qquad (7)$$

Where $U_p$ and $U_n$ are the half-cell open circuit voltages of the cathode and anode, respectively, which are a known function of the solid concentration and the current I, and $c_{s,4}$ is the solid concentration at the $4^{th}$ layer of the discretized model, said $4^{th}$ layer being the layer closest to the separator. The value of $c_{s,4}$ is provided by the extended Kalman filter routine. The diffusion-effect voltage $V_{diff}$ and the double-layer voltages $V_1$ and $V_2$ are also determined by the extended Kalman filter routine, as seen in Equation (6).

Figure 3:
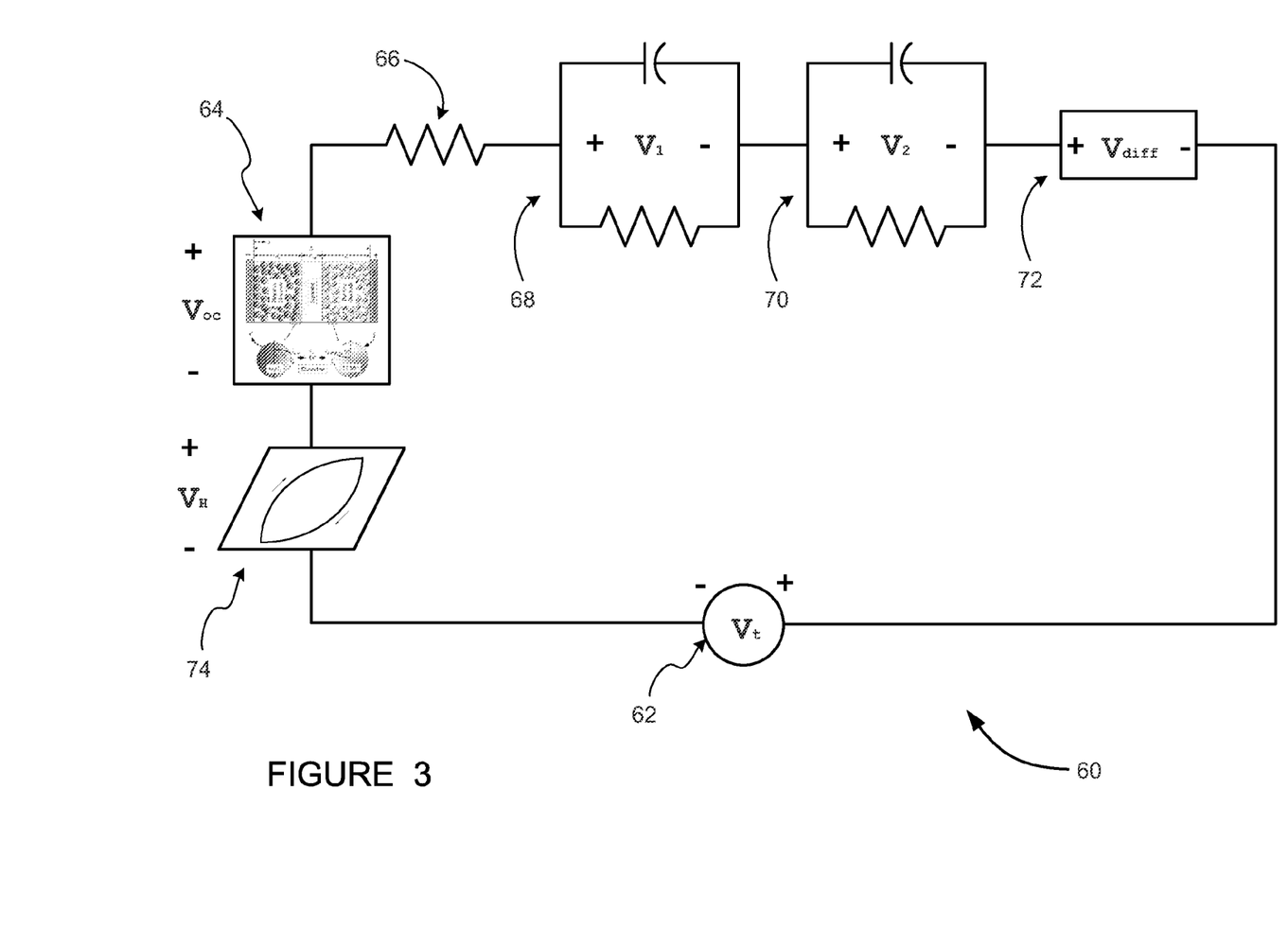
FIG. 3 is a schematic diagram of a hybrid battery state estimator which uses a reduced-order physics-based model to determine open circuit voltage, and calculates diffusion effects and other parameters from the calculated open circuit voltage and a measured terminal voltage.

Thus, the entire state of the battery cell is predicted by the battery state estimator 60, as shown in FIG. 3. The open circuit voltage, $V_{oc}$, is used to determine battery cell state of charge, and the other voltages ($V_1$, $V_2$ and $V_{diff}$) are used for power capability calculation. As discussed above, all of these voltages are continuously corrected to the observed system output terminal voltage, $V_t$, with the current I being a measured system input.

Different techniques can be employed for reducing the order of the solid concentration model so that it can be solved in the extended Kalman filter. The finite difference method described above is one such technique, where the solid diffusion partial differential equation is reduced to an ordinary differential equation. Another technique is to use a pole-residue reduction method, where the solid diffusion partial differential equation is reduced to a transcendental transfer function via application of boundary conditions, and states then can be determined as poles in an eigenvalue expansion approximation of the transcendental transfer function. Other order-reduction techniques may also be employed.

Likewise, other predictor-corrector methods—besides the extended Kalman filter described above—may be used for numerically simulating the state-based system. For example, a recursive least-squares estimation technique could be used.

Figure 4:
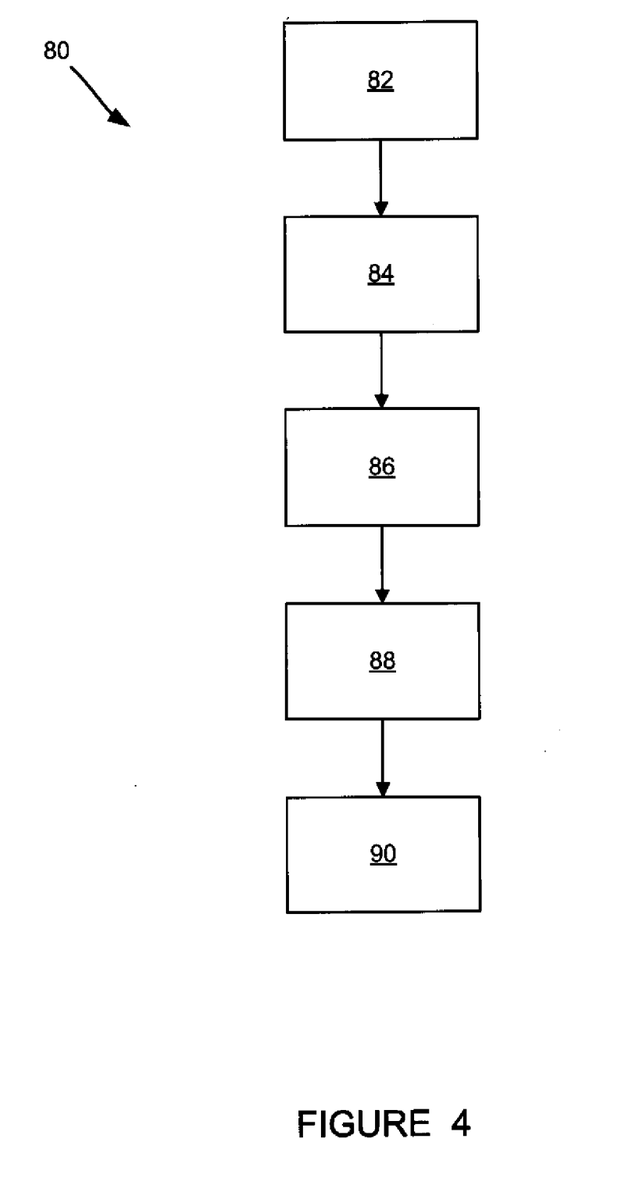
FIG. 4 is a flowchart diagram of a high-level method for determining a state of charge and other parameters for a battery cell, using the hybrid battery state estimator of FIG. 3.

FIG. 4 is a flowchart diagram 80 of a method for determining a state of a battery cell during charging or discharging, using the hybrid battery state estimator 60 of FIG. 3. The flowchart diagram 80 includes the high-level method steps which are involved in using the hybrid battery state estimator 60. At box 82, an equivalent-circuit model of the battery cell is provided. The equivalent-circuit model includes a terminal voltage which is equal to the sum of the diffusion-effect voltage drop, the double-layer voltage drop, the ohmic resistance voltage drop and the open circuit voltage, as discussed above. At box 84, the resistance and capacitance values associated with the double-layer voltage drop and the ohmic resistance voltage drop are established (that is −$R_0$, $R_1$, $R_2$, $C_1$ and $C_2$ as discussed above). The resistance and capacitance values are typically established empirically in a laboratory environment for the battery cell.

At box 86, a reduced-order physics-based model for the battery cell is provided. The reduced-order physics-based model computes the solid concentrations of active material at the solid-electrolyte boundary, and determines open circuit voltage from the concentrations, as discussed in detail above. The model is of a reduced order so as to allow real-time simulation of the battery cell in the vehicle 30, and the order reduction may be accomplished via finite difference approximation or other methods, as discussed above. At box 88, terminal voltage and current readings are obtained for the battery cell, using onboard sensors.

At box 90, the state of the battery cell is calculated by the battery state estimator 60, which may be part of the controller 44. The battery state estimator calculation uses the equivalent-circuit model including the established resistance and capacitance values, the reduced-order physics-based model, and the measured terminal voltage and current. The battery state estimator 60 combines the equivalent-circuit model and the reduced-order electrochemical model in a continuously running numerical predictor-corrector, such as an extended Kalman filter routine, and estimates/optimizes the voltages and concentrations from both models. Specifically, in the case of a finite difference solid concentration model, the battery state estimator 60 calculates the solid concentrations and the voltages—including the diffusion-effect voltage drop $V_{diff}$, the double-layer voltage drop ($V_1$ and $V_2$), the ohmic resistance voltage drop and the open circuit voltage $V_{oc}$. From the open circuit voltage $V_{oc}$, the state of charge of the battery cell can readily be determined, and the state of charge can be used to effectively control charging and discharging operations of the battery pack 34.

Figure 5:
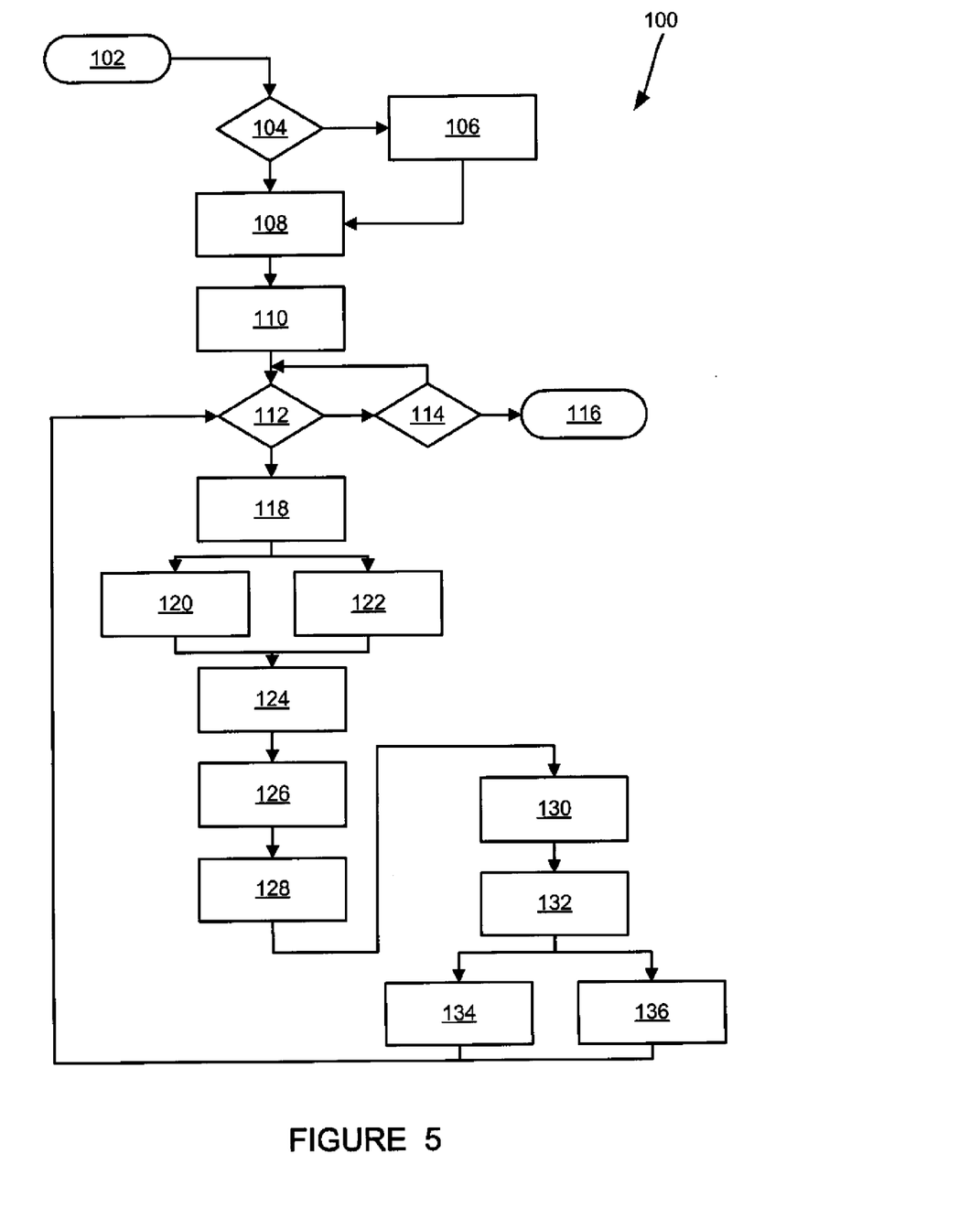
FIG. 5 is a flowchart diagram of a detailed method for determining a state of charge and other parameters for a battery cell, using the hybrid battery state estimator of FIG. 3.

FIG. 5 is a flowchart diagram 100 of a method for determining a state of a battery cell during charging or discharging, using the hybrid battery state estimator 60 of FIG. 3. The flowchart diagram 100 includes the detailed method steps which could be programmed into an algorithm in the controller 44. The method begins with controller wake-up at start oval 102. At decision diamond 104, it is determined whether memory storage has been initialized. If memory storage is not initialized, then at box 106 nominal values for extended Kalman filter states and parameters are stored in memory. At box 108, sensors readings are taken for battery voltage, current and temperature. At box 110, the stored values for extended Kalman filter states and parameters are compensated for temperature and system off-time.

At decision diamond 112, it is determined whether the contactors 38 are closed, thus enabling charging or discharging of the battery pack 34. If the contactors are not closed, then at decision diamond 114 it is determined whether the controller 44 is to be shut down. If the controller 44 is to be shut down, then the algorithm stops and the controller 44 shuts down at terminus 116. If the controller 44 is not to be shut down, then the algorithm loops back to the decision diamond 112 until the contactors 38 are closed. If the contactors are closed at the decision diamond 112, then at box 118 a set of "prediction" calculations for the hybrid battery state estimator 60 are performed. The calculations at the box 118 include the concentration model, voltage drops, circuit parameter estimates and covariance. The calculations at the box 118 are performed using an extended Kalman filter or other state-space numerical estimator, as discussed previously.

At box 120, Kalman gain is calculated based on the predicted covariance and linearized output function. At box 122, the terminal voltage is calculated as a model output, using the predicted concentrations, voltages and circuit parameters. At box 124, sensors readings are again taken for battery voltage, current and temperature. At box 126, an output model error is calculated by taking the difference between the model output terminal voltage and the just-measured battery voltage. At box 128, a set of "update" calculations for the hybrid battery state estimator 60 are performed. The calculations at the box 128 again include the concentration model, voltage drops, circuit parameter estimates and covariance. The calculations at the box 128 are performed using the Kalman gain from the box 120 and the output model error from the box 126.

At box 130, the concentrations, voltages and circuit parameters are stored in memory. At box 132, filtered values of the open circuit voltage and other circuit parameters are provided for subsequent calculations. At box 134, a battery pack state of charge is calculated using the filtered open circuit voltage value from the box 132. At box 136, battery pack power capability is calculated using the filtered open circuit voltage and circuit parameters from the box 132. The battery pack state of charge and power capability, calculated at the boxes 134 and 136, are used to control the battery pack charging and discharging operations, as discussed previously.

After the calculations at the boxes 134 and 136, the process loops back to the decision diamond 112 to determine if the contactors 38 are still closed, and the prediction/measurement/correction calculation loop continues as long as the contactors 38 remain closed.

The techniques described above—where a physics-based electrochemical model open circuit voltage determination is incorporated into an equivalent-circuit model of a battery cell—have been shown in laboratory tests to provide increased open circuit voltage accuracy in comparison to a purely equivalent-circuit model-based battery state estimator. In addition, the hybrid battery state estimator 60—embodied in an extended Kalman filter state-based system simulator as disclosed above—has also been shown to be computationally efficient enough to run in real time in the controller 44. The method of the flowchart diagram 100 can run continuously during vehicle operation to provide accurate and up-to-date battery state information.

Using the hybrid battery state estimator 60, the performance and condition of cells in a battery pack, including their open circuit voltage-based state of charge and other parameters, can be accurately determined during electric vehicle operation. Greater state of charge accuracy allows vehicle designers to optimize battery pack size to the vehicle application, and allows battery pack charging and discharging operations to be optimized during the vehicle's use. These factors in turn lead to longer battery pack life, and increased customer satisfaction.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a state of a battery cell during charging or discharging, said method comprising:
    providing an equivalent-circuit model of the battery cell including a terminal voltage which is equal to a sum of a diffusion-effect voltage drop, a double-layer voltage drop, an ohmic resistance voltage drop and an open circuit voltage;
    establishing resistance values and capacitance values associated with the double-layer voltage drop and the ohmic resistance voltage drop in the equivalent-circuit model;
    providing a reduced-order electrochemical model for determining an open circuit voltage value based on calculations of solid concentrations of active material at a positive electrode and a negative electrode of the battery cell;
    obtaining measured terminal voltage data and measured current data for the battery cell during charging or discharging, where the measured data is obtained using sensors; and
    calculating the state of the battery cell, using a microprocessor, based on the equivalent-circuit model, the established resistance values and capacitance values, the reduced-order physics-based model and the measured terminal voltage data and current data.

2. The method of claim 1 wherein the double-layer voltage drop in the equivalent-circuit model is modeled as a first parallel resistor-capacitor pair and a second parallel resistor-capacitor pair, where the first and second parallel resistor-capacitor pairs have different time constants.

3. The method of claim 2 wherein establishing resistance values and capacitance values includes empirically determining the resistance values and capacitance values of the first and second parallel resistor-capacitor pairs.

4. The method of claim 1 wherein the reduced-order electrochemical model includes a finite difference approximation of the solid concentrations of active material at the electrodes, and models each solid particle in the electrodes as three or more discrete layers.

5. The method of claim 4 wherein the open circuit voltage value is determined from the solid concentration of active material at a solid-electrolyte interface.

6. The method of claim 1 wherein calculating the state of the battery cell includes combining the equivalent-circuit model and the reduced-order electrochemical model in a continuously running numerical predictor-corrector, and calculating the state of the battery cell based on the measured terminal voltage data and current data.

7. The method of claim 6 wherein calculating the state of the battery cell includes using an extended Kalman filter.

8. The method of claim 1 wherein calculating the state of the battery cell includes calculating the open circuit voltage, the solid concentrations of active material at the electrodes, the diffusion-effect voltage drop and the double-layer voltage drop.

9. The method of claim 8 further comprising calculating a state of charge of the battery cell based on the calculated open circuit voltage.

10. The method of claim 9 wherein the state of charge of the battery cell is used by a battery controller to control charging and discharging of the battery cell.

11. A method for determining a state of a battery cell in an electric vehicle battery pack during charging or discharging, said method comprising:
    providing an equivalent-circuit model of the battery cell including a terminal voltage which is equal to a sum of a diffusion-effect voltage drop, a double-layer voltage drop, an ohmic resistance voltage drop and an open circuit voltage;
    establishing resistance values and capacitance values associated with the double-layer voltage drop and the ohmic resistance voltage drop in the equivalent-circuit model, where the double-layer voltage drop in the equivalent-circuit model is modeled as a first parallel resistor-capacitor pair and a second parallel resistor-capacitor pair, and the first and second parallel resistor-capacitor pairs have different time constants;
    providing a reduced-order electrochemical model for determining an open circuit voltage value based on calculations of solid concentrations of active material at a positive electrode and a negative electrode of the battery cell;

obtaining measured terminal voltage data and measured current data for the battery cell during charging or discharging, where the measured data is obtained using sensors;

calculating the state of the battery cell, using a microprocessor, based on the equivalent-circuit model, the established resistance values and capacitance values, the reduced-order electrochemical model and the measured terminal voltage data and current data, where the state of the battery cell includes the open circuit voltage, the solid concentrations of active material at the electrodes, the diffusion-effect voltage drop and the double-layer voltage drop; and calculating a state of charge of the battery cell based on the calculated open circuit voltage.

12. The method of claim 11 wherein the reduced-order electrochemical model includes a finite difference approximation of the solid concentrations of active material at a solid-electrolyte interface, and models each solid particle in the electrodes as three or more discrete layers.

13. The method of claim 11 wherein calculating the state of the battery cell includes combining the equivalent-circuit model and the reduced-order electrochemical model in an extended Kalman filter routine, and calculating the state of the battery cell based on the measured terminal voltage data and current data.

14. The method of claim 11 further comprising using the state of charge of the battery cell by a battery controller to control charging and discharging of the electric vehicle battery pack.

15. A system for determining a state of a battery cell during charging or discharging, said system comprising:

a voltmeter for measuring voltage data for the battery cell;
an ammeter for measuring current data for the battery cell; and
a controller in communication with the voltmeter and the ammeter, said controller including a processor and a memory, said controller being configured to compute the state of the battery cell using the measured voltage data and current data as input to a hybrid battery state estimator, where the hybrid battery state estimator includes an equivalent-circuit model and a reduced-order electrochemical model combined in a continuously running numerical predictor-corrector, where the equivalent-circuit model includes a terminal voltage which is equal to a sum of a diffusion-effect voltage drop, a double-layer voltage drop, an ohmic resistance voltage drop and an open circuit voltage, and the reduced-order electrochemical model includes a finite difference approximation of solid concentrations of active material at a solid-electrolyte interface for positive and negative electrodes of the battery cell.

16. The system of claim 15 wherein the double-layer voltage drop in the equivalent-circuit model is modeled as a first parallel resistor-capacitor pair and a second parallel resistor-capacitor pair, where the first and second parallel resistor-capacitor pairs have different time constants.

17. The system of claim 15 wherein the reduced-order electrochemical model models each solid particle in the electrodes as three or more discrete layers, and an open circuit voltage is determined from the solid concentration of active material at the solid-electrolyte interface.

18. The system of claim 15 wherein the hybrid battery state estimator includes an extended Kalman filter routine running in a prediction/correction loop to simultaneously estimate the equivalent-circuit model and the reduced-order electrochemical model.

19. The system of claim 15 wherein the hybrid battery state estimator is further configured to compute a state of charge based on an open circuit voltage.

20. The system of claim 19 wherein the state of charge is used to control charging and discharging of an electric vehicle battery pack which contains the battery cell.

* * * * *